(12) United States Patent
Bolognia et al.

(10) Patent No.: US 10,399,850 B2
(45) Date of Patent: *Sep. 3, 2019

(54) TRANSDUCER WITH ENLARGED BACK VOLUME

(71) Applicant: Invensense, Inc., San Jose, CA (US)

(72) Inventors: David Bolognia, North Andover, MA (US); Kieran P. Harney, Andover, MA (US)

(73) Assignee: INVENSENSE, INC., San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/671,854

(22) Filed: Aug. 8, 2017

(65) Prior Publication Data

US 2017/0334715 A1 Nov. 23, 2017

Related U.S. Application Data

(63) Continuation of application No. 13/925,076, filed on Jun. 24, 2013, now Pat. No. 9,738,515.

(60) Provisional application No. 61/664,780, filed on Jun. 27, 2012.

(51) Int. Cl.
*H04R 19/04* (2006.01)
*B81C 1/00* (2006.01)
*B81B 7/00* (2006.01)
*B81B 3/00* (2006.01)
*H04R 19/00* (2006.01)

(52) U.S. Cl.
CPC ........ *B81C 1/00333* (2013.01); *B81B 3/0094* (2013.01); *B81B 7/0032* (2013.01); *H04R 19/005* (2013.01); *H04R 19/04* (2013.01); *H01L 2224/48091* (2013.01); *H01L 2224/48137* (2013.01); *H01L 2924/16152* (2013.01); *H04R 2201/003* (2013.01); *H04R 2499/11* (2013.01)

(58) Field of Classification Search
CPC ........ H04R 1/04; H04R 1/342; H04R 19/005; H04R 19/04; H04R 2201/003; H04R 2499/11; B81B 3/0094; B81B 7/0032; B81B 7/0061; B81B 2201/0257
USPC ....... 381/113, 355, 356, 357, 358, 360, 369, 381/174, 175; 257/415, 416; 438/51
See application file for complete search history.

(56) References Cited

U.S. PATENT DOCUMENTS

| 4,277,814 A | 7/1981 | Giachino et al. |
| 4,533,795 A | 8/1985 | Baumhauer, Jr. et al. |
| 4,776,019 A | 10/1988 | Miyatake |
| 5,586,183 A | 12/1996 | Marcus et al. |
| 5,740,261 A | 4/1998 | Loeppert et al. |
| 6,163,071 A | 12/2000 | Yamamura |
| 6,178,249 B1 | 1/2001 | Hietanen et al. |

(Continued)

*Primary Examiner* — Huyen D Le
(74) *Attorney, Agent, or Firm* — Maryam Imam; Hickman Palermo Becker Bingham LLP

(57) ABSTRACT

A packaged integrated device includes a package substrate having a first surface and a second surface opposite the first surface, and the package substrate has a hole therethrough. The integrated device package also includes a first lid mounted on the first surface of the package substrate to define a first cavity, and a second lid mounted on the second surface of the package substrate to define a second cavity. A microelectromechanical systems (MEMS) die can be mounted on the first surface of the package substrate inside the first cavity and over the hole. A port can be formed in the first lid or the second lid.

17 Claims, 8 Drawing Sheets

(56) References Cited

U.S. PATENT DOCUMENTS

| | | |
|---|---|---|
| 6,324,907 B1 | 12/2001 | Halteren et al. |
| 6,522,762 B1 | 2/2003 | Mullenborn et al. |
| 6,594,369 B1 | 7/2003 | Une |
| 6,732,588 B1 | 5/2004 | Mullenborn et al. |
| 6,781,231 B2 | 8/2004 | Minervini |
| 7,715,583 B2 * | 5/2010 | Van Halteren ....... H04R 19/005 381/355 |
| 8,767,982 B2 * | 7/2014 | Harney .................. H04R 1/342 381/174 |
| 9,738,515 B2 * | 8/2017 | Bolognia ............ B81C 1/00333 |
| 2007/0040231 A1 | 2/2007 | Harney et al. |
| 2011/0127623 A1 | 6/2011 | Fueldner et al. |

\* cited by examiner

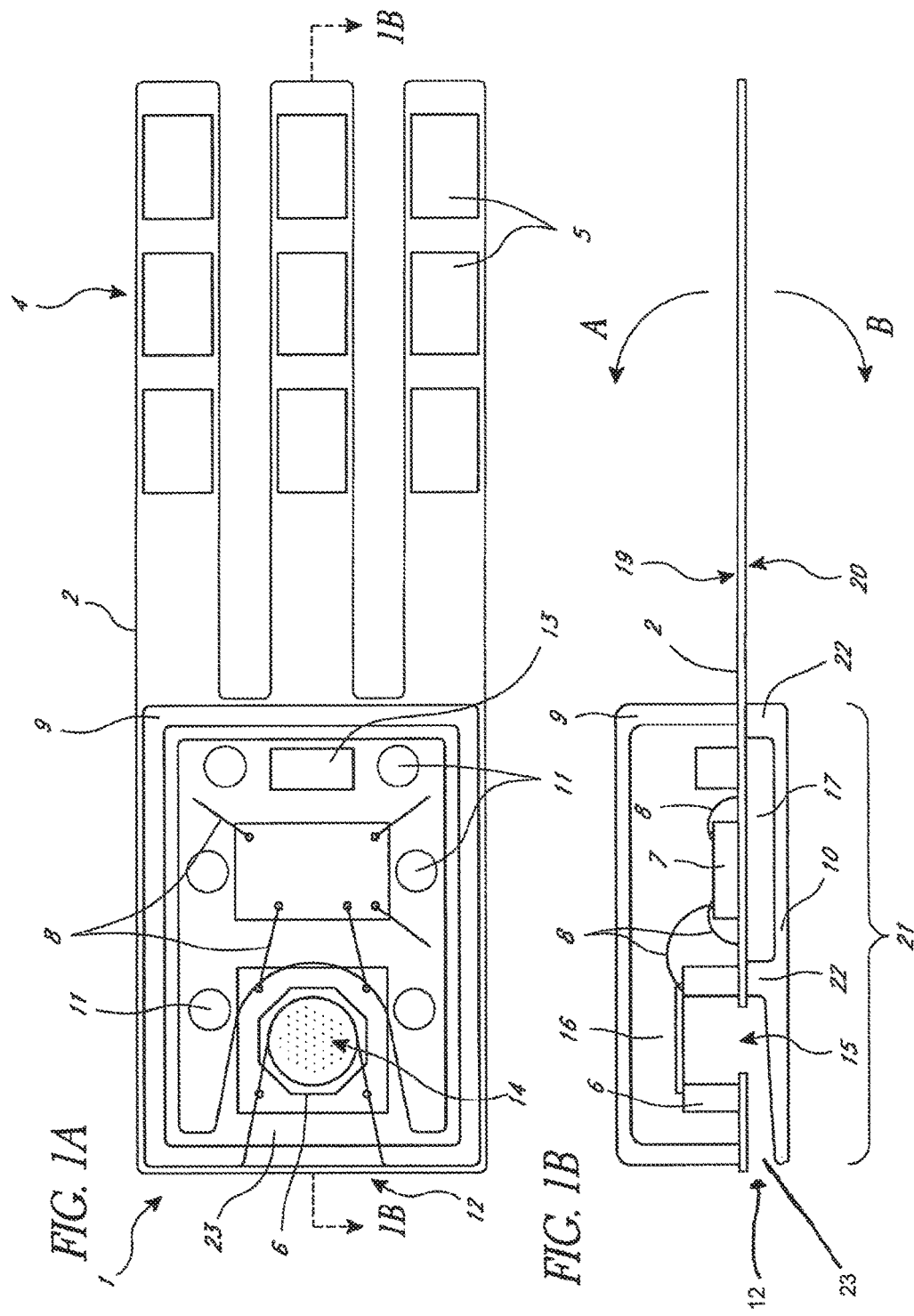

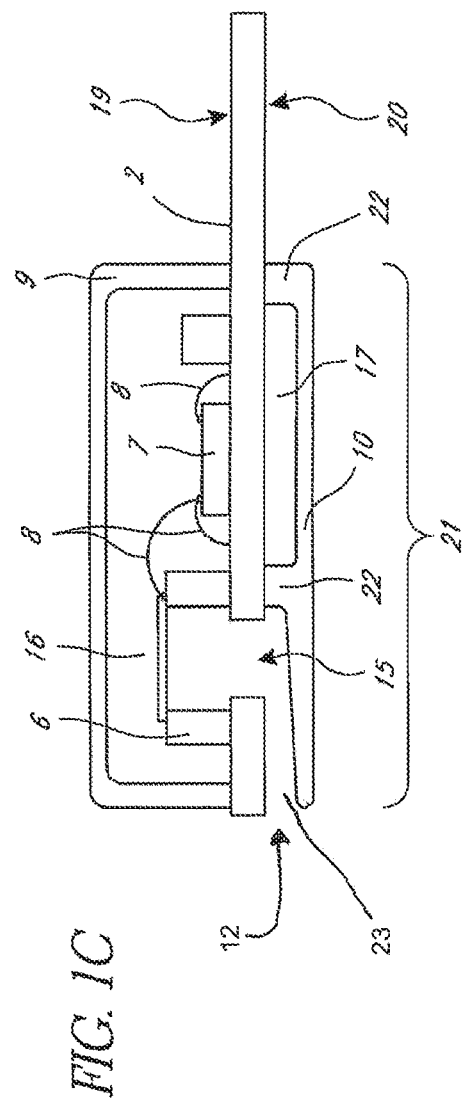

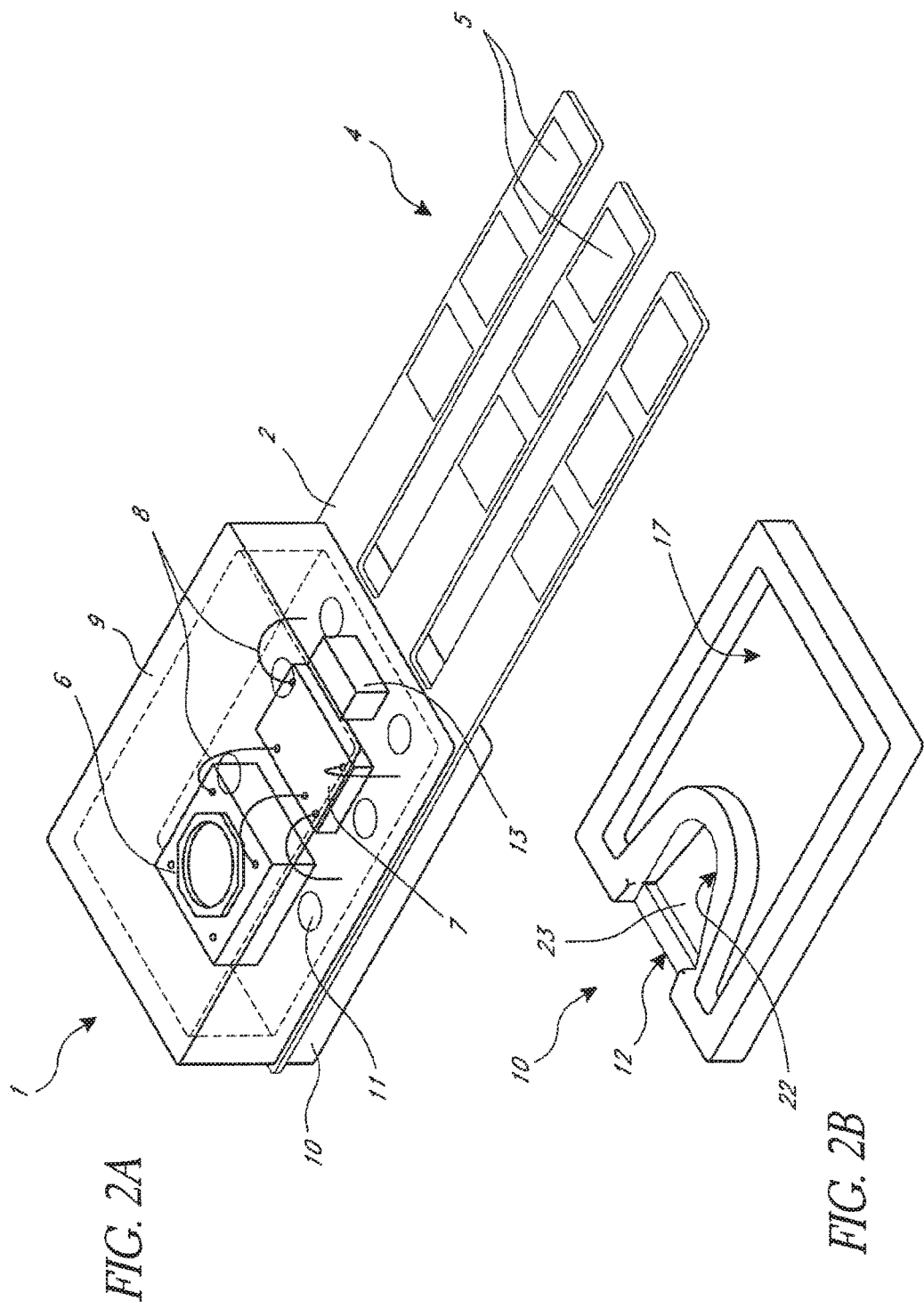

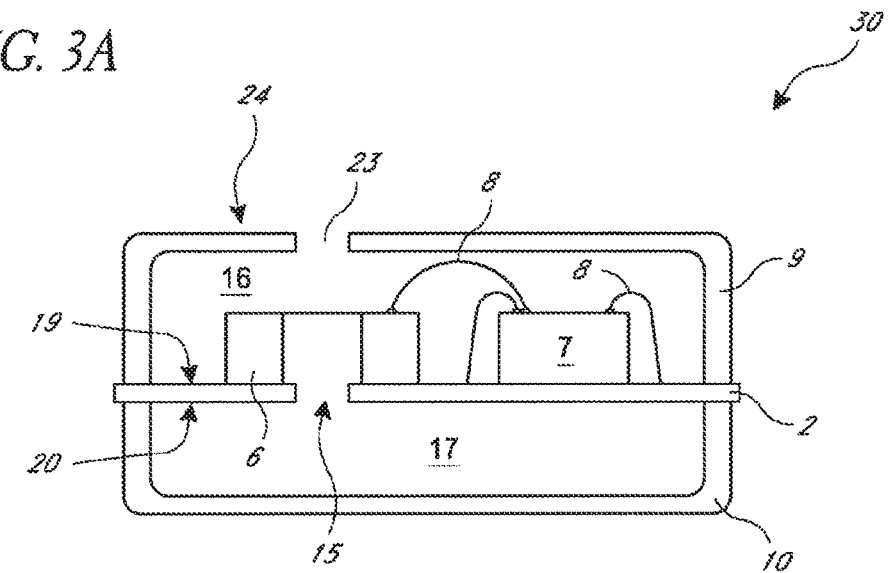
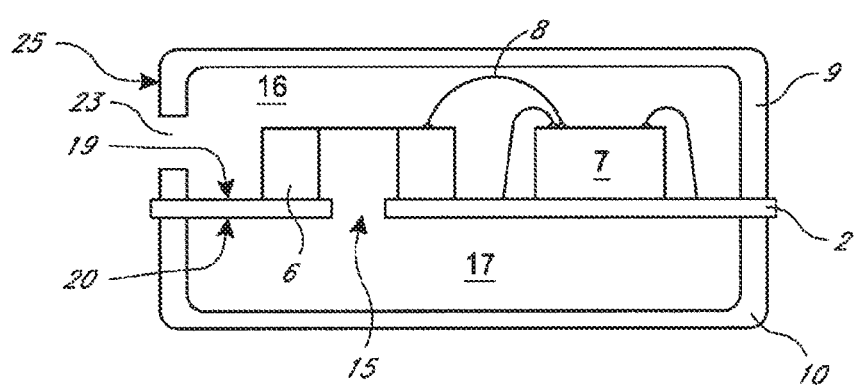

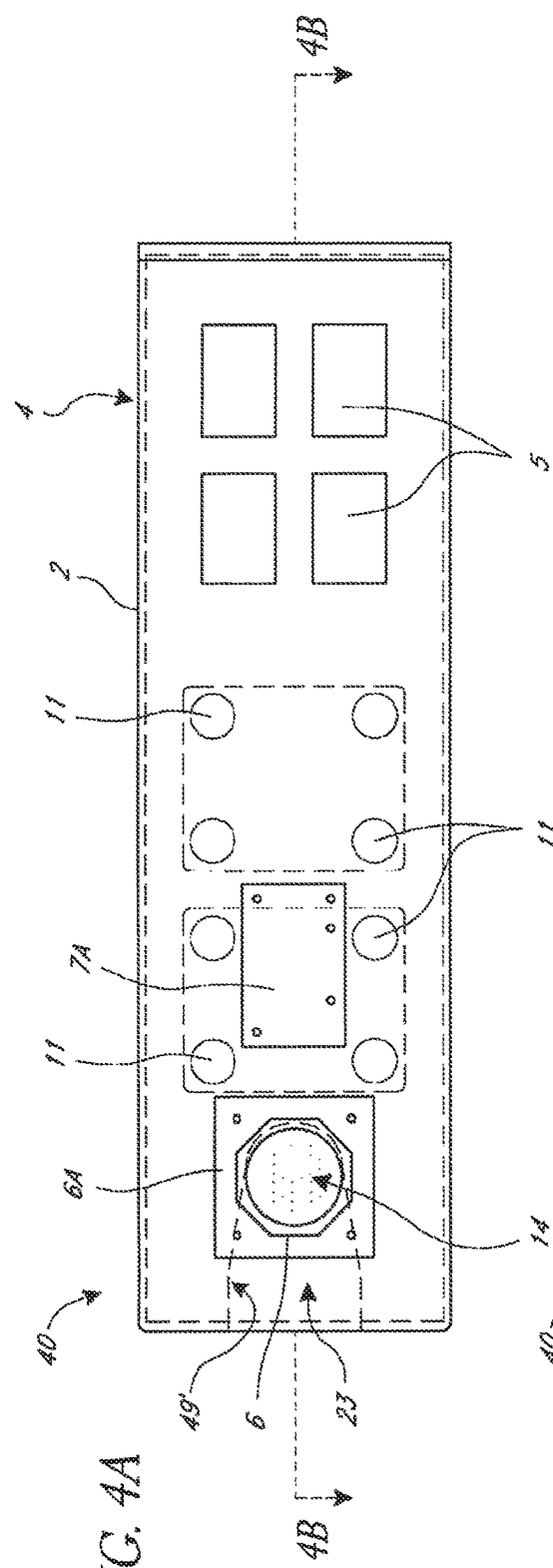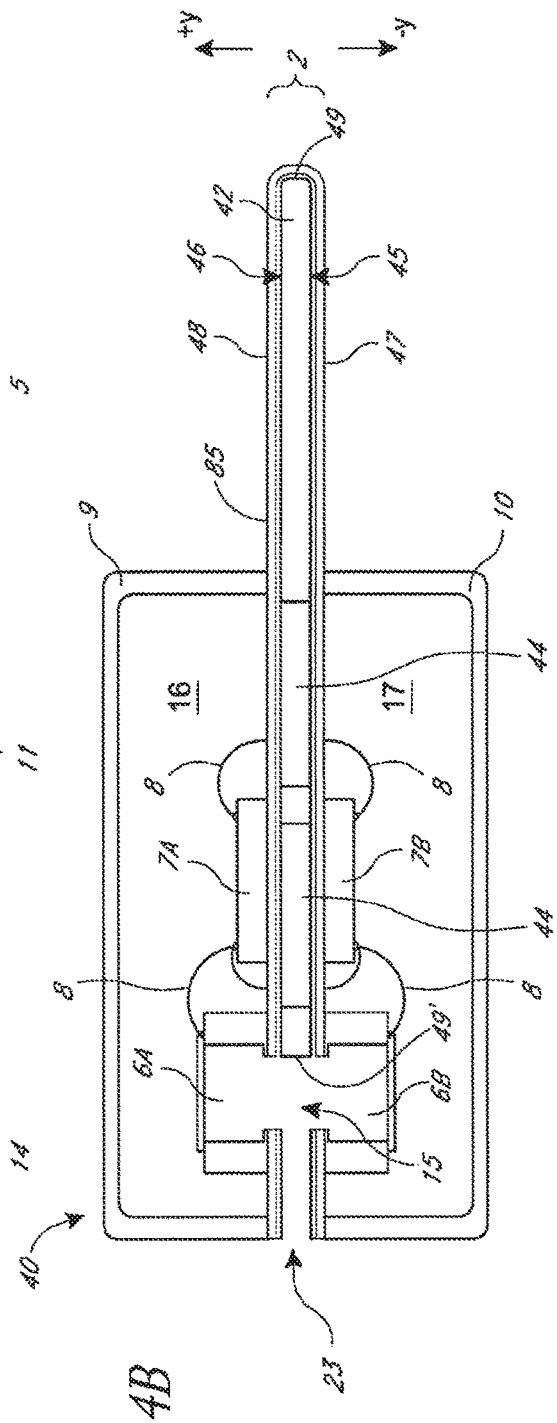

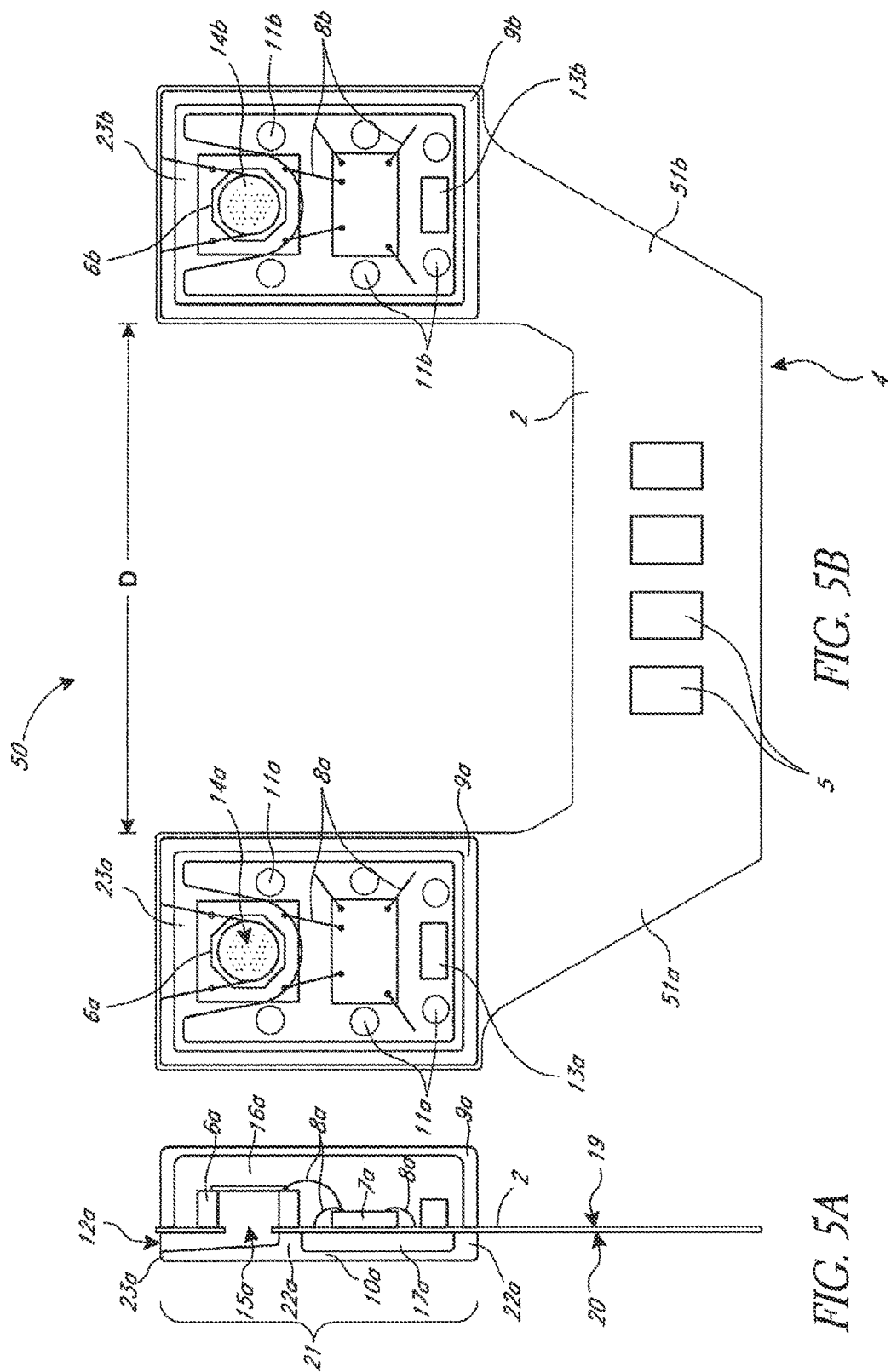

TRANSDUCER WITH ENLARGED BACK VOLUME

PRIORITY

This patent application is a continuation application of U.S. patent application Ser. No. 13/925,076, filed Jun. 24, 2013, by David Bolognia, et al., entitled, "Transducer with Enlarged Back Volume", which claims priority from provisional U.S. patent application No. 61/664,780, filed Jun. 27, 2012, entitled, "TRANSDUCER WITH ENLARGED BACK VOLUME," and naming David Bolognia and Kieran Harney as inventors, the disclosure of which is incorporated herein, in its entirety, by reference.

FIELD OF THE INVENTION

The invention generally relates to transducer packages and, more particularly, the invention relates to transducer packages and back volumes.

BACKGROUND OF THE INVENTION

MEMS devices can be useful in a variety of applications, including, for example, sensors that communicate with the surrounding environment, such as pressure sensors or acoustic sensors. In such applications, components of the MEMS devices can interact with the environment, and the interaction can be converted into electrical signal(s) that can be processed by a processor. Such MEMS devices include, but are not limited to, MEMS microphones, MEMS pressure sensors, MEMS flow sensors, and other applications.

Microphone device dies (including, e.g., MEMS microphone dies) are often secured within a package for environmental protection. The package can include a package lid mounted to a package substrate, and a port can be formed through some portion of the package to allow audio signals to reach the microphone.

SUMMARY OF VARIOUS EMBODIMENTS

In accordance with one embodiment of the invention, a packaged microphone has a substrate with a first side and a second side, and a MEMS microphone mounted to the first side of the substrate. The packaged microphone also has a first lid coupled with the first side of the substrate to form a first cavity, and a second lid coupled with second side of the substrate to form a second cavity. The MEMS microphone is positioned within the first cavity, and the first and second cavities are fluidly connected.

In some embodiments, a package has a package substrate with a first surface and a second surface opposite the first surface, the package substrate having a first hole therethrough. The package can further include a first lid mounted on the first surface of the package substrate to define a first cavity, and a second lid mounted on the second surface of the package substrate to define a second cavity. A first integrated device die can be mounted on the first surface of the package substrate inside the first cavity and over the first hole, and a first port is formed in the package.

In another embodiment, a microphone device package can include a package substrate having a first surface and a second surface opposite the first surface. The package substrate has a first hole therethrough and one or more back volume apertures. The package can further include a first lid mounted on the first surface of the package substrate to define a first cavity, and a second lid mounted on the second surface of the package substrate to define a second cavity, where the one or more back volume apertures provide fluid communication between the first cavity and the second cavity. A first microphone die can be mounted on the package substrate inside the first cavity and over the first hole. A first port can be formed in the package and in fluid communication with the first hole.

In yet another embodiment, a method for packaging an integrated device can provide a package substrate having a hole therethrough, where the package substrate has a first surface and a second surface opposite the first surface. The method can further mount an integrated device die on the first surface of the package substrate over the hole. Furthermore, the method can mount a first lid on the first surface of the package substrate to define a first cavity and to enclose the integrated device die on the package substrate. The method can mount a second lid on the second surface of the package substrate to define a second cavity. The package substrate, first lid and second lid together form a package having a port.

In another embodiment, a kit for packaging an integrated device die includes a package substrate having a first surface and a second surface opposite the first surface. The package substrate has a hole therethrough. The kit can further include a first lid configured to be mounted on the first surface of the package substrate to define a first cavity. Additionally, the kit can include a second lid configured to be mounted on the second surface of the package substrate to define a second cavity. The package substrate, first lid and second lid together form a package having a port formed therein.

For purposes of summarizing the disclosure and the advantages achieved over the prior art, certain benefits are described. Of course, it should be understood that not necessarily all such benefits may be achieved in accordance with any particular embodiment. Thus, for example, those skilled in the art will recognize that the principles and benefits taught herein may be embodied or carried out in a manner that achieves or optimizes one benefit or group of benefits as taught or suggested herein without necessarily achieving other benefits as may be taught or suggested herein.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

FIG. 1A is a schematic top plan view through a top lid of a package according to one embodiment, showing outlines of a bottom lid for purposes of illustration.

FIG. 1B is a side cross-sectional view of the package of FIG. 1A.

FIG. 1C is a side cross-sectional view of a packaged integrated device according to another embodiment.

FIG. 2A is a perspective view of the package of FIGS. 1A and 1B.

FIG. 2B is a perspective view of the bottom lid used in the package of FIGS. 1A-2A.

FIGS. 3A-3C are side cross-sectional views of packages according to various embodiments.

FIG. 4A is a top plan view of a package substrate with mounted integrated devices, according to another embodiment, showing outlines of an embedded support in the substrate.

FIG. 4B is a side cross-sectional view of the package of FIG. 4A, showing its two lids.

FIG. 5A is a side cross-sectional view of a package according to yet another embodiment.

FIG. 5B is a top plan view of the package of FIG. 5A, viewing through the top lids and showing outlines of the bottom lids for purposes of illustration.

DESCRIPTION OF ILLUSTRATIVE EMBODIMENTS

Figure 3C:
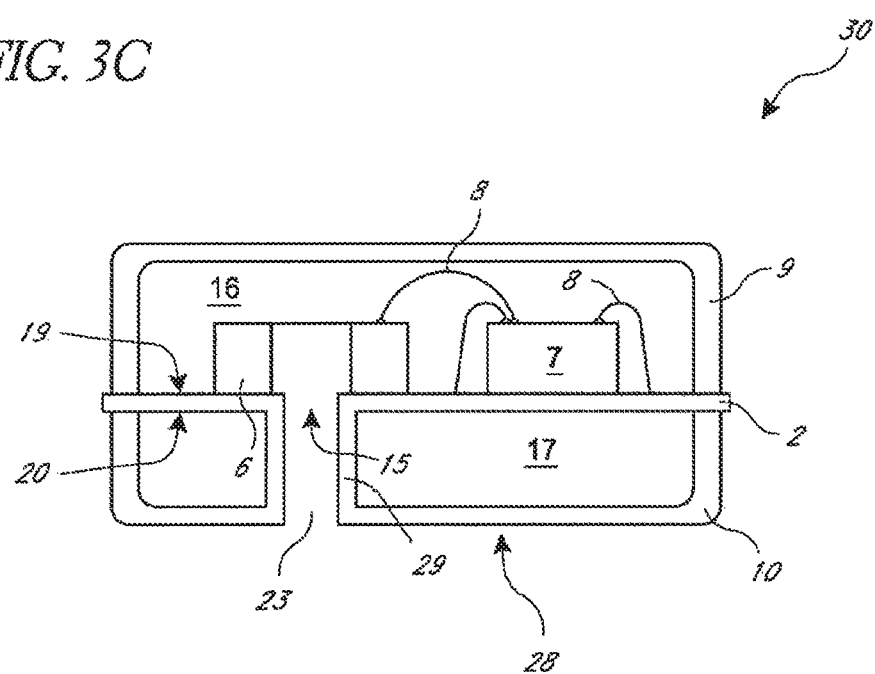

In illustrative embodiments, a packaged integrated device, such as a packaged microphone, has an enlarged back volume to improve system performance. Some such embodiments also have an aperture extending through the side of the package. To those ends, the device has an additional lid beneath its base substrate that is fluidly connected with its internal microphone via one or more through-holes. Details of illustrative embodiments are discussed below.

Packaged integrated devices and methods of packaging the same are described below with reference to the accompanying drawings. As with common patent conventions, the drawings are schematic and not to scale. Also, note that while reference may be made to various top and bottom surfaces or sides, it should be appreciated that this is for ease of reference only. In general, the top and bottom surfaces can refer to first and second surfaces generally, without regard to a particular orientation.

In illustrative embodiments, integrated device dies (including, e.g., processor dies, MEMS dies, and any other suitable device die) can be packaged in a variety of ways. For example, some MEMS and/or microphone packages can include one or more integrated device die(s) mounted on one surface of a package substrate, and one or more lids can be attached to the one surface of the package substrate to enclose the integrated device die(s).

It can be helpful to increase the back volume within a microphone package to optimize signal quality and microphone sensitivity. However, space for the microphone package (or, e.g., any suitable package) can be limited. As one example, hearing aids can use any suitable microphone device (including, e.g., MEMS microphones) to detect sound waves. The detected sound waves can be further processed by an integrated circuit die to amplify the detected sound for a user of the hearing aid. Because the hearing aid must fit within a portion of the ear or ear canal (or, in some arrangements, behind the ear), the microphone die should be small enough to fit within or proximal to the ear.

In some arrangements, for example, the hearing aid body can include a slender (and sometimes curved) body, which can make it difficult to contain a packaged microphone. In various conventional microphone systems, the microphone package employs a port through either the top or bottom of the package. For a hearing aid (or other compact packaging application), it can be difficult to arrange the microphone package such that the port faces the direction in which sound waves are expected to propagate. For example, the package for the microphone may be turned on its side such that the top or bottom port faces out the ear canal or otherwise in the direction of expected sound propagation. Undesirably, this arrangement can occupy a great deal of space within the hearing aid body.

FIG. 1A is a top plan view of a packaged integrated device (or "package" or "packaged microphone") 1 according to one embodiment. FIG. 1B is a side cross-sectional view of the package 1 shown in FIG. 1A.

The package 1 can include a package substrate 2 for supporting electrical and mechanical components (discussed below). The package substrate 2 can be configured to electrically connect the package 10 to a system substrate (e.g., a printed circuit board) or other larger electrical apparatus or system. As discussed in more detail below, the package substrate 2 can also include a tail region 4 configured to electrically couple to an external device by way of leads/pads/contacts 5 (e.g., with a connector or a surface mount connection). The package substrate 2 can be formed from a variety of materials, including, for example, a ceramic package material or a printed circuit board (PCB) material (e.g., a flex substrate, and/or a preimpregnated composite material, such as FR-4 board, and a metal, such as copper), or pre-molded plastic with leadframes. For example, FIG. 1C illustrates a package substrate 2 that can be formed, e.g., of a PCB material, e.g. FR-4 board or BT and a metal. As shown in FIG. 1C, the package substrate 2 can be relatively thick. The package substrate 2 of FIG. 1C may have a tail region for electrical connections to a system board in some embodiments; however, in other embodiments, there may be no tail region.

In the embodiment of FIGS. 1A-1C, the package substrate 2 can also use a substrate 2 of Kapton tape or polyimide. However, greater or lesser degrees of bendability can be achieved by choice of materials and thickness, as desired for particular applications. The substrate further can be a laminated substrate including integrated metal traces for routing electrical signals between various packages, devices, and systems. The substrate can include a polymer material, such as a polyimide or a PEEK material. Skilled artisans will understand that other materials are possible. The substrate can include integrated bond pads, traces and leads similar to those used in conventional substrate technologies. In some applications, the substrate can be formed from a material and thickness that can be bent or folded to conform to a particular geometry. The traces and leads can be patterned on the substrate in very small dimensions. For example, in some embodiments, the traces can have line widths and spaces on the order of about 15 µm to 20 µm, and the leads or bond pads can have widths or diameters of about 200-300 µm with similar spacing, such that the pitch is on the order of 400-600 µm.

The package substrate 2 can have a thickness ranging between about 40 µm and about 3 mm in various embodiments. For example, the thickness can have a range of between about 40 µm and about 100 µm. As another example, the substrate 2 can be thicker (e.g., between about 200 µm and about 3 mm).

With continued reference to FIGS. 1A-1C, an integrated device die 6 can be mounted on a top surface 19 of the package substrate 2. In the illustrated embodiment of FIGS. 1A-1B the first integrated device die 6 is a MEMS microphone die, although other dies may be suitable. The integrated device die 6 can be mounted on the top surface 19 of the package substrate 2 over a hole 15 formed through the package substrate. The hole 15 can be configured to allow sound waves to pass from outside the package 1 to interact with the integrated device die 6. In some implementations, the hole 15 can have a filter with a plurality of openings 14 therethrough. The openings 14 can be sized and shaped to be small enough to filter out unwanted debris, yet large enough to allow sound waves to adequately propagate through the hole 15. Alternatively, the package can have an array of small holes formed in the substrate itself, eliminating the need to separately fabricate and integrate a filter.

In some arrangements, the integrated device die 6 can include a movable plate and a backplate (not illustrated). The integrated device die 6 can also have an internal cavity. During operation of the microphone, audio signals can reach a first side of the movable plate, and the movable plate can be deflected by a pressure difference between the first, and a second, opposing side of the plate. The backplate can be fixed and can be separated from the movable plate by a gap, and therefore can serve in conjunction with the movable plate to form electrodes of a variable capacitor that can be configured to detect audio signals. For example, audio signals can cause the movable plate to vibrate relative to the fixed backplate, thereby producing a changing capacitance. The backplate can include backplate apertures, which allow the second side of the membrane to communicate with a cavity (hereinafter "back volume"). In some embodiments, the integrated device die 6 can be fabricated from a silicon or silicon-on-insulator (SOI) wafer, with a die thickness typical of integrated MEMS devices, e.g., about 300-400 microns. Other dimensions are possible. Although reference has been made to certain dimensions for the components of the integrated device die 6, persons of ordinary skill in the art will recognize that many other choices are appropriate.

While the illustrated embodiments may relate in particular to a microphone die (e.g., a MEMS microphone die), it should be appreciated that other integrated device dies are suitable, including, e.g., pressure sensor dies. Moreover, while the illustrated microphone device is a MEMS microphone device, it should be appreciated that non-MEMS microphone devices can be implemented in similar arrangements. For example, an electret condenser microphone (ECM) device can be used in some embodiments. Skilled artisans will understand that still other package arrangements are possible.

An integrated circuit die 7 can also be mounted to the top surface 19 of the package substrate 2. The integrated circuit die 7 can be used to process data from the integrated device die 6 (or other integrated device), and can be an application specific integrated circuit (ASIC). In the embodiment illustrated in FIGS. 1A-1B, bonding wires 8 connect the integrated device die 6 to the integrated circuit die 7, thereby allowing the integrated circuit die 7 to process electrical signals received from and/or sent to the integrated device die 6. The integrated circuit die 7 can also communicate with the package substrate 2 using the bonding wires 8. For example, the bonding wires 8 can be configured to electrically connect the integrated circuit die 7 to traces (not shown in FIGS. 1A-1C) on the package substrate 2, thereby permitting communication with external circuitry (e.g., a hearing aid, mobile device, or other electronic device). Although the integrated circuit die 7 can be mounted on the package substrate 2 using an adhesive, in certain implementations, the integrated circuit die 7 can be connected in other ways. For example, solder bumps or balls could be deposited onto chip pads on the top side of the integrated circuit die 7, and after flipping the die upside down and aligning the chip pads to matching pads on the package substrate 2, the solder could be flowed so as to mechanically and electrically interconnect the die and the package substrate. The integrated device die 6 can be mounted to the package substrate 2 in similar ways. In addition, in various embodiments, one or more passive component(s) 13 (such as, e.g., capacitors or resistors) can be mounted on the package substrate 2 to operate on various electrical signals.

A member or plurality of members that forms a cavity with the substrate 2 can be mounted on the top surface 19 of the package substrate 2 to define a first cavity 16. This member or plurality of members is referred to herein as a "top lid 9." As shown in FIG. 1B, the integrated device die 6 can be mounted within the first cavity 16. The top lid 9 can be formed using one or more materials, including metal or a polymer such as a plastic. For applications in which it is desirable for the top lid 9 to provide radio frequency (RF) shielding and/or to transmit electrical signals, which is often desired for microphone packages, the top lid 9 can be formed of metal, or can be formed of an insulative material, such as ceramic or plastic, with a conductive layer. The package 1 can also include a lid adhesive for bonding the top lid 9 to the top surface 19 of the package substrate 2. The lid adhesive can be, for example, solder or an epoxy. The lid adhesive can be conductive and can be configured to electrically connect the top lid 9 to traces (e.g., grounded) on the package substrate 2, thereby aiding in mitigating the potential impact of electromagnetic interference and/or reducing static charge build-up in the top lid 9.

A bottom lid 10 can be mounted on a bottom surface 20 of the package substrate 2 to define a second cavity 17 between the bottom lid 10 and the package substrate 2. The bottom lid 10 can be mounted to the package substrate 2 using any of the materials and methods described above for the top lid 9. Similarly, the bottom lid 10 can be formed of any suitable material, as described above for the top lid 9.

The top and/or bottom lids 9 and 10 can be formed from a single member (e.g., a single metal component), or from multiple components. For example, the multiple component embodiments may use a generally flat base plate and one or more walls that form the respective cavities 16 and 17. Accordingly, discussion of single or unitary member lids 9 and 10 are for illustrative purposes only and not intended to limit various embodiments.

FIG. 2A shows a three-dimensional perspective top view of the package 1 of FIGS. 1A and 1B. In a similar manner, FIG. 2B shows a three-dimensional perspective top view of the bottom lid 10. As shown in FIGS. 1A-2B, the bottom lid 10 can include a fluid inlet region 12 formed in a side wall 22 of the bottom lid 10 (see, e.g., FIG. 2B). The fluid inlet region 12 can be configured to allow for the ingress of air or fluid into the package 1. The fluid inlet region 12 can include a port 23 for the package 1 that can operate to enable fluid communication between the exterior of the package 1 and the first cavity 16 (FIG. 1B) such that the air can communicate with the MEMS microphone die 6. As illustrated best in FIGS. 1B and 2B, the port 23 can be formed by inwardly shaping the side wall 22 of the bottom lid 10 such that a portion of the side wall 22 extends inwardly beyond the hole 15 (FIG. 1B) formed through the package substrate 2. The illustrated side wall 22 can be mounted to the second surface 20 (FIG. 1B) of the package substrate 2 to physically separate the fluid inlet region 12 (and the port 23) from the second cavity 17. Thus, as shown in FIGS. 1A-2B, incoming sound waves can pass through the fluid inlet region 12 and the port 23 and can pass through the hole 15 to electrically communicate with the MEMS microphone die 6. Because the side wall 22 of the bottom lid 10 separates the fluid inlet region 12 from the second cavity 17, the sound waves can pass directly through the hole 15. The sound waves can travel through the MEMS microphone die 6 to fluidly communicate with the first cavity 16 formed in the package 1.

While the port 23 and fluid inlet region 12 can be formed by a shaped side wall of the bottom lid 10 in some arrangements, in other embodiments, the port 23 can include a hole formed through the top or bottom lids. In addition, the top lid 9 can be shaped and sized to maximize the available back volume in the first cavity 16 to thereby increase the sensitivity and effectiveness of the microphone device.

People of ordinary skill in the art will appreciate that increasing the back volume can, in many applications, improve sound performance of the packaged microphone device 1. By selecting the size of the back volume, desired MEMS microphone device performance for a given application can be achieved. Thus, as explained above, the top lid 9 can be sized to allow for the appropriate amount of back volume for the microphone. However, a further advantage of the illustrated embodiment is that the second cavity 17 formed between the second lid 10 and the package substrate 2 can be used to further increase the back volume for the package 1 in some arrangements. As shown in FIGS. 1A and 2A, one or more back volume apertures 11 can be formed in the package substrate 2 to provide fluid communication between the first cavity 16 and the second cavity 17. By using both the first cavity 16 and the second cavity 17 for back volume, the performance of the microphone package 1 can be improved. Moreover, the illustrated arrangement permits use of a side port in a microphone package without sacrificing the back volume.

As shown in FIGS. 1A-1B and 2A, the package substrate 2 can include the tail region 4 configured to electrically couple to a system substrate on or within a larger electronic device or system. The tail region 4 can be bendable or unbendable. The tail region 4 can include a portion of the package substrate 2 that extends from the portions of the package substrate 2 that are configured for mounting integrated device die(s). As shown in FIG. 1B, for example, the tail region 4 can extend outwardly from the lid/cover 9. The tail region 4 can include a plurality of split regions, such as, e.g., the three split regions shown in FIG. 1A. In addition, the tail region 4 can include one or more electrical contacts 5 that are configured to electrically connect the package substrate 2 to the system substrate of the larger electronic system (e.g., through a surface mount connection, or using a connector).

As explained above, in many applications, space for electrical interconnections can be limited. For example, in compact packaging applications, it can be difficult to package both the device die and the electrical contacts to fit within the design tolerances. For example, as mentioned above, hearing aid bodies can be small, slender, and/or elongated in some implementations.

The tail region 4 illustrated in FIGS. 1A-1B can advantageously be used in arrangements where there is limited space for arranging electrical contacts above or below the package 1. For example, the tail region 4 can extend outwardly from the package and can couple to a system substrate that is positioned away from the lid/cover 9. In other embodiments, the tail region 4 (or a portion thereof) can be wrapped over at least a portion of the top lid 9 or the bottom lid 10, by wrapping the tail region 4 in a first direction A or second direction B, respectively, as shown in FIG. 1B. By wrapping around the top or bottom lid (or the top or bottom of the package 1 generally), the tail region 4 can advantageously couple to a system substrate positioned above or below the package 1, while still allowing for enhanced back volume enabled by the use of both lids and the first and second cavities 16, 17, respectively. For example, the tail region can be wrapped in the first direction and then surface mounted to a system substrate. Because a side port can be used, neither wrapping above nor below interferes with the port. Moreover, the contacts 5 of the substrate can be double-sided, such that the decision as to whether to wrap over the top or the bottom of the package 1 can be made at the time of mounting into the larger system.

FIGS. 3A-3C show other embodiments of a package 30. Unless otherwise noted, reference numerals can refer to components generally similar to those illustrated in FIGS. 1A-2B. As in FIGS. 1A-2B, in FIGS. 3A-3C, the package 30 can include a package substrate 2. An integrated device die 6 (e.g., a MEMS die) and an integrated circuit die 7 can be mounted on a top surface 19 of the package substrate 2. As above, the integrated device die 6 can be mounted over a hole 15. In addition, a top lid 9 can be mounted on the top surface 19 of the package substrate to form a first cavity 16, and a bottom lid 10 can be mounted on a bottom surface 20 to form a second cavity 17. Unlike FIGS. 1A-2B, however, a port 23 can be a hole formed through a top side 24 of the top lid 9 (e.g., FIG. 3A), a side wall 25 of the top lid 9 (e.g., FIG. 3B), or a bottom wall 28 of the bottom lid 10. In other arrangements (not illustrated), the port 23 can be a hole formed through a side wall of the bottom lid 10.

As shown in FIGS. 3A-3B, the top and bottom lids 9, 10, can be mounted on opposite sides of the package substrate. In the illustrated embodiments, the port hole 23 can provide fluid communication to the first cavity 16 and to the integrated device die 6 (e.g., a microphone die). Unlike in FIGS. 1A-2B, however, the hole 15 can provide fluid communication to the second cavity 17, which can act as the back volume for the package 1. In some embodiments, the bottom lid 10 can therefore be shaped and sized to optimize the back volume to improve sensitivity of the microphone. The top lid 9 can be very low profile, as it does not function as back volume in the embodiments of FIGS. 3A-3B. Alternatively, a portion of the top lid can be sealed from the first cavity 16, which communicates with the port 23, and holes can be provided through the package substrate 2 between the sealed portion and the second cavity 17 to expand the back volume.

In FIG. 3C, the port 23 is formed through the bottom wall 28 of the bottom lid 10. As illustrated, an air way 29 can fluidly couple the first cavity 16 with the outside environs such that the air way 29 is separated from the second cavity 17. Although not illustrated, the embodiments of FIGS. 3A and 3B can similarly include such an air way to seal the first cavity 16 from the outside environs. Air or other fluid can thereby fluidly communicate with the integrated device die 6 by way of the port 23 and the air way 29. In various applications, such as microphone applications, the first cavity 16 can act as a first back volume space. Moreover, as explained with regard to FIGS. 1A-1B, one or more back volume apertures 11 (not shown in FIG. 3C) can be formed in the package substrate 2 to enable fluid communication between the first cavity 16 and the second cavity 17. The second cavity 17 can thus act as additional back volume to improve device sensitivity.

FIGS. 4A and 4B show another embodiment of an integrated device package 40. Unless otherwise noted, similar components are referenced by like reference numbers among the various embodiments disclosed herein. In FIGS. 4A and 4B, the package substrate 2 can include a support member 42 (also referred to herein as "support 42") and a laminate substrate 85 having a top portion 48 and a bottom portion 47. The laminate substrate 85 can be bendable or include a bendable segment between the top portion 48 and bottom portion 47. Alternatively, the top and bottom portions can be independent. The support 42 can be configured to provide support to the laminate substrate 85. The support 42 can have a top surface 46, a bottom surface 45 opposite the top surface, and one or more side edges 49. In some embodiments, the support 42 can be formed of a hard plastic material.

In FIGS. 4A-4B, the laminate substrate 85 can be folded or wrapped around the support 42, such that the top portion 48 of the laminate substrate 85 is coupled to the top surface 46 of the support and the bottom portion 47 of the substrate 85 is coupled to the bottom surface 45 of the support 42. As shown in FIG. 4B, the laminate substrate 2 can be folded around the support 42 at about a 180 degree angle. A first integrated device die 6A can be mounted on the top portion 48 of the laminate substrate 85, and a second integrated device die 6B can be mounted on the bottom portion 47 of the laminate substrate 85. The first and second integrated device dies 6A, 6B can be any suitable die, including, e.g., a microphone die as explained above (such as a MEMS microphone die). In addition, a first processor die 7A can be mounted on the top portion 48 and can electrically couple to the first integrated device die 6A via bonding wires 8. A second processor die 7B can be mounted on the bottom portion 47 and can electrically couple to the second integrated device die 6B via bonding wires 8. As above, a top lid 9 can be mounted on the top portion 48 and can define a first cavity 16. A bottom lid 10 can be mounted on the bottom portion 47 and can define a second cavity 17.

A hole 15 can be formed through the support 42 and the top and bottom portions 48, 47 of the substrate 85. As shown best in FIG. 4B, a port 23 can be formed in one of the side edges 49 of the support 42. In various embodiments, air or fluid can flow from the outside environs through the port 23 in the side edge 49 to fluidly communicate with the hole 15 and the first and second integrated device dies 6A, 6B. The port 23 can be formed by an inwardly shaped, curved region 49' of the side edge 49, as shown best in FIG. 4A. Moreover, as in the above embodiments, one or more back volume apertures 11 can be formed in the top and bottom portions 48, 47 of the package substrate 2. In order to provide fluid communication between the first cavity 16 and the second cavity 17, one or more openings 44 can be formed in the support 42. The one or more back volume apertures 11 can overlap or be formed over the one or more openings 44. As a result, air can pass from the outside environs through the port 23 in the side edge 49 and into both the first and second cavities 16, 17 by way of the common hole 15. Air can further pass between the first and second cavities 16, 17 by way of the back volume apertures 11 formed in the package substrate and the openings 44 formed in the support 42. For certain applications, as with other embodiments described above, acoustic performance can be advantageously increased by utilizing both cavities 16, 17 for back volume.

As in the above-described embodiments, the package 1 can include at least the top lid 9, the bottom lid 10, and the package substrate 2. Moreover, the package substrate 2 can include a support and Kapton tape, wherein the Kapton tape can be wrapped around the support. Edge(s) 49 of the support 42 and portions of the top and bottom lids 9, 10 can form side walls or surfaces of the package 1. The port 23 can be formed in the package 1. For example, as shown in FIGS. 4A-4B, the port 23 can be formed through the side edge 49 of the support 42. In other embodiments, however, the port 23 can be formed through a side wall or surface (or a top or bottom surface) of the top or bottom lids 9, 10, as explained above with respect to FIGS. 1A-3C.

The package 40 of FIGS. 4A-4B can advantageously be used to minimize the effects of vibration on signals detected by the package 40. For example, in various embodiments, when the system moves rapidly or vibrates, the induced vibrations along the y-direction can distort the sound waves when the package vibrates within various frequency ranges. By mounting two integrated device dies 6A, 6B opposite and upside-down relative to each other in the y-direction, induced vibrations can be substantially canceled out. For example, as the first integrated device die 6A moves by an amount 6A in the +y-direction, the second integrated device die 6B ideally moves by substantially the same amount δB in the −y-direction. Thus, interference with the acoustic signal caused by induced vibrations can be substantially canceled or significantly mitigated.

FIGS. 5A-5B show another embodiment of a package 50. Unless otherwise noted, reference numerals in FIGS. 5A and 5B may denote components similar to those disclosed in FIGS. 1A-4B. In FIGS. 5A-5B, the package substrate 2 has a bendable region. The package substrate 2 includes a first arm 51a and a second arm 51b spaced from the second arm 51a by a distance D. In some embodiments, the distance D can range from between about 2 mm and about 20 mm. For example, in one embodiment, the distance D is about 8 mm. The package 50 can include a first integrated device die 6a mounted on the first arm 51a over a first hole 15a and a second integrated device die 6b mounted on the second arm 51b over a second hole 15b. As above, top lids 9a, 9b can be mounted on the top surface 19 of the first arm 51a and second arm 51b, respectively, and can define first cavities 16a, 16b, respectively. A bottom lid 10 can be mounted on the bottom surface 20 of the first arm 51a and second arm 51b, respectively, and can define second cavities 17a, 17b, respectively. As described above with respect to FIGS. 1A-3C, one or more back volume apertures 11a, 11b can be formed through the package substrate 2 to provide fluid communication between the first cavities 16a, 16b and the second cavities 17a, 17b, respectively. Ports 23a and 23b can be formed in the top lids 9a, 9b or the bottom lids 10a, 10b, as explained with respect to the embodiments of FIGS. 1A-4B above.

The embodiment of FIG. 5A-5B can provide improved sensitivity. For example, the two microphone devices (e.g., including the microphone die, the top and bottom lids, and the sound port) can be positioned such that the sound ports 23 are arranged in the same direction, as shown in FIG. 5B, in order to receive more sound coming from a particular direction. The two microphones can be tuned, or their signals processed, to sense different frequencies, or to filter. In other embodiments, the two microphone devices can be rotated relative to one another by bending the substrate in a desired configuration. By orienting the sound ports 23 in different directions, each microphone die can receive sound waves from different directions. This configuration can be particularly advantageous in hearing aid applications where it can be desirable to detect sound coming from different directions. Moreover, while only two arms are shown in FIG. 5B, it should be appreciated that three or more arms (and three or more microphone devices) can be provided to provide enhanced sensing in more than two directions.

Figure 6:
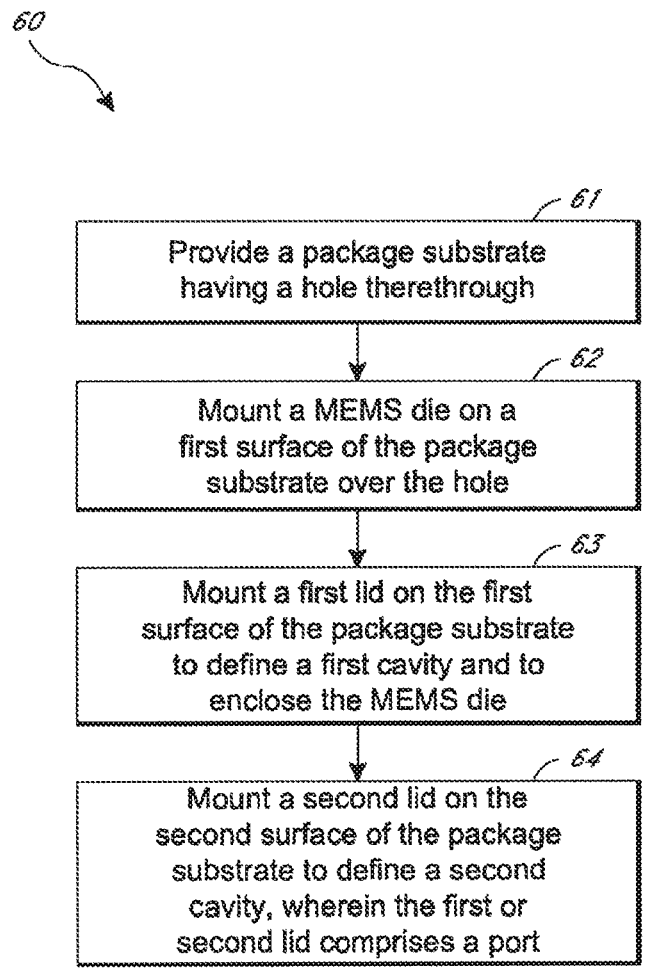
FIG. 6 is a flowchart illustrating a method for packaging an integrated device according to one embodiment.

In FIG. 6 shows one method 60 for packaging an integrated device die, such as a MEMS microphone. In Block 61, a package substrate having a hole therethrough is provided. In some embodiments, the package substrate can include one or more back volume apertures to provide fluid communication between cavities formed in the package.

In Block 62, a MEMS die is mounted on a first surface of the package substrate over the hole. For example, the process may use conventional adhesives to physically secure the die(s) onto the substrate. Also, in some embodiments, a processor die can be mounted on the package substrate to process signals received by the MEMS (or non-MEMS) die that is over the hole. The processor die can be electrically coupled to the MEMS or microphone die using, e.g., wire bonds in some embodiments.

Turning to Block 63, a first lid is mounted on a first surface of the package substrate to define a first cavity and to enclose the MEMS or microphone die. As described above, the first lid can be formed of any suitable material, including, e.g., a metal and/or plastic lid. The first lid can thus include materials to shield the package from RF radiation/EMI. In some embodiments, the first lid can include a port that provides fluid communication from the package exterior to the first cavity; in other embodiments, the first lid has no openings.

In Block 64, a second lid is mounted on a second surface of the package substrate to define a second cavity. In some embodiments, the second lid can include a port that provides fluid communication between the package exterior and the second cavity; in other embodiments, the second lid has no openings. In some arrangements, the port is formed in a side wall of the second lid. For example, the second lid can define a fluid inlet region that includes the port. Air can pass through the fluid inlet region to the port, which provides fluid communication to the hole in the package substrate. Sound waves or fluid can therefore travel from the package exterior through the fluid inlet region and the port, and into the first cavity through the hole. In some embodiments, the side wall of the second lid is inwardly shaped. The inwardly shaped side wall can be mounted to the package substrate to physically separate the hole in the package substrate from the second cavity.

Devices employing the above described schemes can be implemented into various electronic devices. Examples of the electronic devices can include, but are not limited to, medical devices (including, e.g., hearing aids), consumer electronic products, parts of the consumer electronic products, electronic test equipment, etc. Examples of electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a washer, a dryer, a washer/dryer, a copier, a facsimile machine, a scanner, a multi-functional peripheral device, a wrist watch, a clock, etc. Further, the electronic device can include unfinished products.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while several variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the claims that follow.

For example, in some embodiments, the package can include one or more openings therein to provide fluid communication between the first or second cavities and the outside environs. The one or more openings can be formed through the package substrate, the top lid and/or the bottom lid. For example, when the package is assembled within a larger system, such as being mounted to a system board, the system may include additional enclosures or cavities surrounding or positioned over the package. The one or more openings in the package can thereby further enhance device sensitivity by utilizing additional back volume provided by the additional system cavities or enclosures. It should be appreciated that the one or more openings in the package can be included in all embodiments disclosed herein.

Moreover, while only one MEMS die and one ASIC die are shown in various embodiments, it should be appreciated that two or more MEMS dies, and/or two or more ASIC dies, can be mounted to the package substrate. For example, in some embodiments, two MEMS dies and one ASIC die are mounted within the first cavity 16. Alternatively, two MEMS dies and two ASIC dies can be mounted within the first cavity 16. In other embodiments, one or more MEMS dies and one or more ASIC dies can also be mounted within the second cavity 17. For example, in one embodiment, two MEMS dies and one ASIC die are mounted within the first cavity 16, and two MEMS dies and one ASIC die are mounted within the second cavity 17. In other embodiments, more than two MEMS dies can be used. In another embodiment, the package substrate can include two arms spaced apart from each other, and each arm can have one or more MEMS dies and one or more ASIC dies mounted thereon. For example, each arm can include two MEMS dies and an ASIC die mounted within the first cavity 16. In some embodiments, each arm can further include two MEMS dies and an ASIC die mounted within the second cavity 17. In addition, two or more holes can also be provided in the package substrate to accommodate any additional MEMS dies. Skilled artisans will understand that the total number of integrated device and/or integrated circuit dies can vary.

What is claimed is:

1. A microphone package comprising:
  a package substrate including a first arm and a second arm spaced from the first arm by a distance;
  a first microphone die mounted on the first arm;
  a second microphone die mounted on the second arm;
  a first top lid mounted on a top surface of the first arm;
  a second top lid mounted on a top surface of the second arm, the first and second top lids defining first and second top cavities;
  a first bottom lid mounted on a bottom surface of the first arm;
  a second bottom lid mounted on a bottom surface of the second arm, the first and second bottom lids defining first and second bottom cavities; and
  two or more apertures formed through the package substrate to provide fluid communication between the first and second top cavities with the first and second bottom cavities, respectively; and
  sound ports formed in the first and second top lids or the first and second bottom lids,
  wherein signals of the first and second microphone dies are processed to filter.

2. The microphone package of claim 1, wherein the first and second microphone dies, the first and second bottom lids and the sound ports are positioned such that the sound ports are arranged in the same direction in order to receive more sound coming from a particular direction relative to other directions.

3. The microphone package of claim 1, wherein the first and second microphone dies are tuned to sense different frequencies.

4. The microphone package of claim 1, wherein the first and second microphone dies are tuned to serve as filter.

5. The microphone package of claim 1, wherein signals of the first and second microphone dies are processed to sense different frequencies.

6. The microphone package of claim 1, wherein the sound ports are oriented in different directions causing the first and second microphone dies to receive sound waves from different directions.

7. The microphone package of claim 6, wherein the orientation of the sound ports is suited for hearing aid applications.

8. The microphone package of claim 1, wherein the sound ports are oriented to cause the first and second microphone dies to receive sound waves from a common direction.

9. The microphone package of claim 1, wherein the sound ports are oriented in the direction of sound.

10. The microphone package of claim 1, further including three or more arms to provide enhanced sensing in more than two directions.

11. The microphone package of claim 1, further including three or more microphone dies to provide enhanced sensing in more than two directions.

12. The microphone package of claim 1, wherein the first and second microphone dies are each MEMS dies.

13. The microphone package of claim 1, further comprising electrical contacts on the package substrate to electrically connect the first and second microphones.

14. The microphone package of claim 1, further comprising an integrated circuit die mounted on the package substrate.

15. The microphone package of claim 1, further comprising first and second integrated circuit die mounted within the top cavities.

16. The microphone package of claim 1, where in sidewall separates the bottom cavities and the sound ports.

17. The microphone package of claim 1, wherein each of the sound ports comprise an aperture and a portion of the lid facilities passage of the sound waves towards the microphone die.

* * * * *